(12) United States Patent
Pasqualini et al.

(10) Patent No.: US 7,591,597 B2
(45) Date of Patent: Sep. 22, 2009

(54) METHOD OF MOVING A DEVICE PROVIDED WITH A CAMERA TO A DESIRED POSITION BY MEANS OF A CONTROL SYSTEM, AND SUCH A SYSTEM

(75) Inventors: Andrea Pasqualini, Eindhoven (NL); Dennis Erwin Bos, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 446 days.

(21) Appl. No.: 10/561,458

(22) PCT Filed: Jun. 21, 2004

(86) PCT No.: PCT/IB2004/050944

§ 371 (c)(1),
(2), (4) Date: Dec. 20, 2005

(87) PCT Pub. No.: WO2004/114739

PCT Pub. Date: Dec. 29, 2004

(65) Prior Publication Data

US 2006/0153426 A1     Jul. 13, 2006

(30) Foreign Application Priority Data

Jun. 24, 2003    (EP)   ................................. 03101851

(51) Int. Cl.
     *G03B 7/00*        (2006.01)
     *G03B 17/00*       (2006.01)

(52) U.S. Cl. ........................................ 396/428; 396/65

(58) Field of Classification Search ................ 396/428, 396/104, 106, 120–123, 65; 359/399, 400, 359/401; 348/239, 135
See application file for complete search history.

(56) References Cited

U.S. PATENT DOCUMENTS

| | | | |
|---|---|---|---|
| 5,084,959 A * | 2/1992 | Ando et al. | 29/740 |
| 5,311,304 A | 5/1994 | Monno | |
| 5,590,456 A | 1/1997 | Armington et al. | |
| 5,602,614 A * | 2/1997 | Ohtsuka et al. | 396/61 |
| 5,880,849 A | 3/1999 | Van De Ven | |
| 6,826,362 B2 * | 11/2004 | Matsuo | 396/104 |
| 7,059,043 B2 * | 6/2006 | Hidese et al. | 29/832 |
| 2002/0101214 A1 | 8/2002 | Iisaka et al. | |

* cited by examiner

*Primary Examiner*—Reena Aurora

(57) ABSTRACT

A method for moving a device (4) provided with a camera (5) to a desired position (10) by means of a control system (7). The camera (5) is connected with the control system (7). Pictures are taken by means of the camera during movement. The number of pictures processed per time unit by means of the control system (7) is increased when the distance between the device (4) and the desired position (10) becomes smaller.

6 Claims, 2 Drawing Sheets

METHOD OF MOVING A DEVICE PROVIDED WITH A CAMERA TO A DESIRED POSITION BY MEANS OF A CONTROL SYSTEM, AND SUCH A SYSTEM

The invention relates to a method of moving a device provided with a camera to a desired position by means of a control system, wherein the camera is coupled to the control system.

The invention further relates to a system comprising a device provided with a camera, which device can be moved to a desired position by means of a control system, wherein the camera is coupled to the control system.

In such a method, which is known from U.S. Pat. No. 5,880,849, and in such a system, the device is a component placement machine provided with a nozzle by means of which components are picked up from a component feeder, after which the device is moved to a position above a substrate on which the component is subsequently positioned. The device is provided with a camera by means of which a single picture of the component relative to the nozzle is produced as well as a single picture of a part of the substrate. The part of the substrate of which an picture is produced is provided with a marking element. Information regarding the desired position of the component on the substrate relative to the marking element is stored in a control system coupled to the device. On the basis of the pictures produced by means of the camera, a desired control of the device is determined in the control system, such that the component is positioned in the desired position on the substrate.

A drawback of such a method resides in that the desired position of the component relative to the marking element on the substrate is stored in the control system, which desired position is based on a theoretical model of the substrate to be provided with components. If, due to manufacturing inaccuracies, the actual, desired position on the substrate is not accurately situated with respect to the marking element, then the component will be theoretically placed in the correct position, however, in actual fact it will not be positioned correctly on, for example, electroconductive tracks present on the substrate.

Also if previously an picture is produced of the actual location where the component is to be placed, there is still the risk that during moving the component to said desired position, said desired position will have slightly changed, as a result of, for example, vibrations of the device, the device being subject to shocks, and other external factors, as a result of which the component will still be incorrectly positioned on the substrate.

It is an object of the present invention to provide a method by means of which a device can be accurately moved to a desired position.

This object is achieved in the method in accordance with the invention, in that during moving said device, pictures of the desired position are taken by means of the camera, the number of pictures processed per time unit by means of the control system being increased as the distance between the device and the desired position is smaller.

In this manner, during moving the device a number of pictures are taken of the actual, desired position. If the distance between the device and the desired position is comparatively large, the number of pictures taken per time unit and/or processed per time unit may be comparatively small because the movement accuracy during the movement over a comparatively large distance may be comparatively inaccurate. However, as the device is situated closer to the desired position on the substrate, the movement of the device must be more accurately determined in order to eventually accurately reach the desired position.

Therefore, as the distance becomes smaller, the number of pictures processed per time unit by means of the control system is increased in order to be able to determine the movement of the device to the desired position more accurately by means of the control system.

An embodiment of the method according to the invention is characterized in that as the distance between the device and the desired position is smaller, an area situated around the desired position is reduced in a picture which is analyzed by means of the control system.

If the distance between the device and the desired position is comparatively large, an picture must be produced of a comparatively large region around the desired position in order to ensure that the desired position is present in the picture. At a comparatively large distance from the desired position, the accuracy with which the desired position can be determined in the picture is less relevant. However, as soon the device has been moved to a position closer to the desired position, it is important that an accurate picture of the desired position and the surrounding area is produced. This area may be comparatively small, however, as a result of which the speed with which the picture can be analyzed in the control system is comparatively high. As, in addition, at a comparatively small distance from the desired position the number of pictures processed per time unit by means of the control system is increased, a reduction of the area to be analyzed is important also to enable the pictures in the control system to be analyzed comparatively rapidly. The distance between the device and the desired position can be physically determined. Since the device is moved in the direction of the desired position, it is also possible to assume, after a certain period of time has elapsed, that the distance has been reduced, at which moment the area to be analyzed is subsequently reduced.

An embodiment of the method in accordance with the invention is further characterized in that the number of pictures processed per time unit by means of the control system is increased step by step.

By stepwise increasing the number of pictures processed per time unit by means of the control system, for example when a predetermined distance to the desired position has been reached, the desired accuracy during moving the device to the desired position can be readily achieved.

A still further embodiment of the method in accordance with the invention is characterized in that by means of the control system, a movement of the device observed by means of a sensor is combined with information from the pictures produced by means of the camera.

In this manner, direct feedback of the movement of the device observed by means of the sensor as well as of the information regarding the position of the device relative to the desired position obtained from the pictures produced by means of a camera takes place in the control system. Rapid and accurate feedback is thus ensured particularly in the vicinity of the desired position. Besides, as long as the desired position is not yet observable by means of the camera, the device can be moved by means of the sensor.

The invention also relates to providing a system by means of which a device can be accurately moved to a desired position.

In the system in accordance with the invention, this object is achieved in that the control system comprises means for determining a distance between the device and the desired position, as well as means for increasing the number of pictures to be processed per time unit.

Using the means for increasing the number of pictures to be processed per time unit, it is possible to increase the number of pictures to be processed per time unit at a comparatively short distance between the device and the desired position, so that near the desired position more pictures are processed, enabling the device to be more accurately controlled to the desired position.

These and other aspects of the invention are apparent from and will be elucidated with reference to the embodiment(s) described hereinafter.

Figure 1:
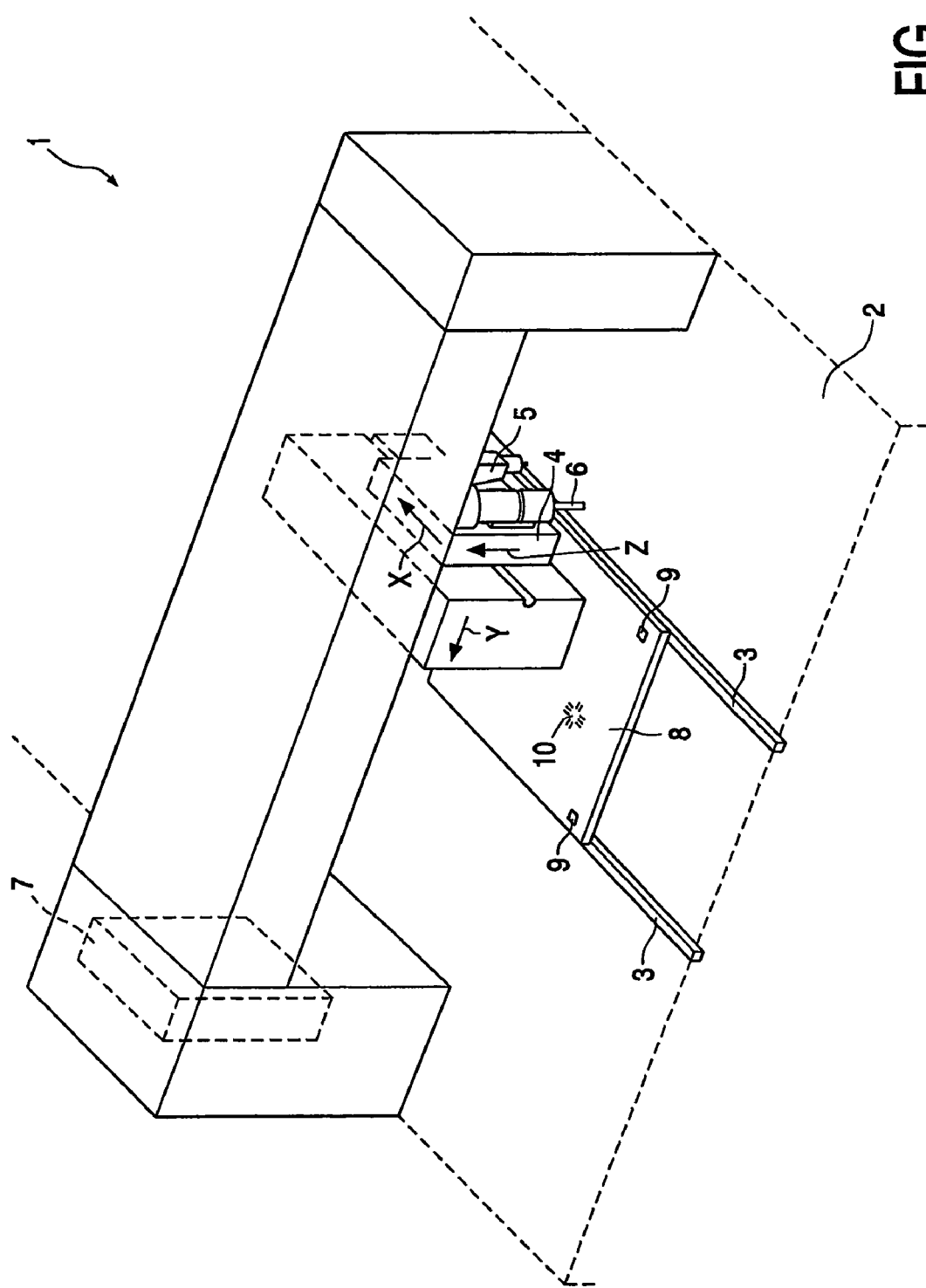
FIG. 1 is a perspective view of a system in accordance with the invention.

FIG. 1 shows a system 1 in accordance with the invention, which is provided with a frame 2, transport rails 3 supported by said frame 2, and a movable device 4 situated above the transport rails 3, which displaceable device is connected with a camera 5 and a nozzle 6. The device 4 can be moved in directions indicated by means of arrows X, Y as well as in opposite directions, using means known per se. The nozzle 6 is further movable in a direction indicated by means of arrow Z, as well as in the opposite direction. The system 1 is provided with a control system 7 which is electrically connected with the camera 5 as well as with drive means for moving the device 4 in the directions indicated by means of arrows X, Y. Said drive means for the device 4 preferably comprise servomotors provided with encoders which serve as a sensor for determining the position in, respectively, the X and the Y direction of the device 4. The encoders are electrically connected with the control system 7.

By means of said transport rails 3, a substrate 8 is moved in the direction indicated by means of arrow X to a position near that of the device 4. On the substrate 8 there are provided a number of reference elements 9 as well as a number of positions 10 on which components are to be positioned. Next to the transport rails 3 a number of component feeders (not shown) are arranged from which a component can be individually picked up by means of the nozzle 6, which component must subsequently be positioned in a desired position on the substrate 8. The system described hitherto is known per se and largely corresponds to the system as described in U.S. Pat. No. 5,880,849.

Figure 2:
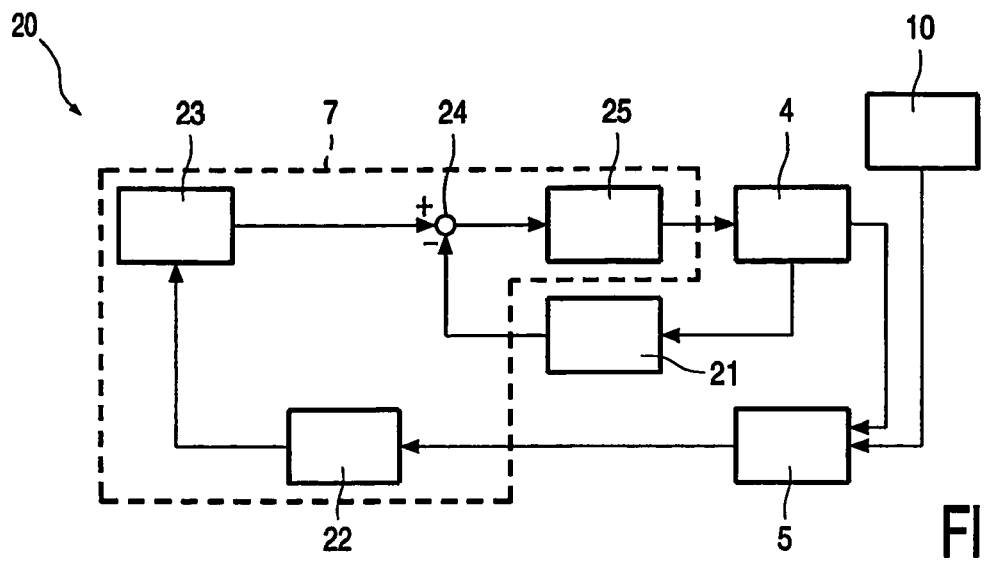
FIGS. 2-4 are control schemes of a control system of the system in accordance with the invention as shown in FIG. 1.

FIG. 2 shows a first embodiment of a control scheme 20 provided in the control system 7. As the camera 5 is connected with the device, the position of the device 4 can be derived. The desired position 10 on the substrate 8 is recorded in a picture by means of the camera 5. The picture and the position of the device are supplied to an image processing device 22. On the basis of the picture thus processed, a planner 23 is used to determine a route to be covered by the device 4 and the component supported thereby, in order to be able to position the component in the correct position 10 on the substrate 8. In the planner 23, also referred to as trajectory generator, an optimum time is calculated for the distance to be bridged by the device, consideration being taken of, inter alia, the maximum speeds of the sensor motors. The processing frequency of such a planner is comparatively low and the number of pictures to be processed may thus also be small. From the device 4, the positions in the X and Y direction of the device 4 as determined by the encoder 21 are supplied to a comparator 24 in which the difference between the position of the device 4 determined from the picture relative to the desired position 10 and the position of the device 4 determined on the basis of the encoders 21 is compared. The difference is supplied to a controller 25 with which the movement to be carried out by the device 4 is determined.

Figure 3:
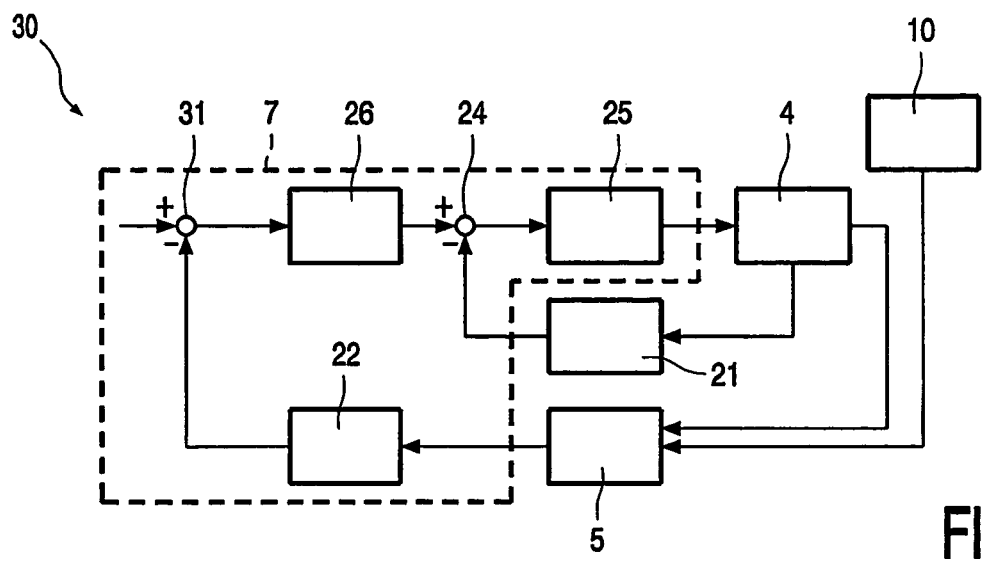

FIG. 3 shows a different control scheme 30 of the control system 7 in accordance with the invention. Said control scheme 30 differs from the control scheme shown in FIG. 2 in that the planner 23 is replaced by a comparator 31 and a unit 26. In the comparator 31, the relative position, determined from a picture, between the device 4 and the desired position 10 is compared with a reference value. This reference value indicates a desired shift of the desired position observed from the picture, and the actual position on which the component must be placed. It is possible, for example, to position the component in a slightly rotated position with respect to a track pattern present on the substrate. It is also possible to omit the comparator 31. The difference is supplied to a unit 26 wherein a path to be followed by the device 4 is calculated. The size of the area to be analyzed situated around the desired position 10, which area is processed by means of the image processor 22, can be optically reduced for the purpose of accurately moving the device 4. The area to be analyzed around the desired position 10 is reduced, both in terms of software and optically, as the distance between the device 4 and the desired position 10 becomes smaller. The calculations by the unit 26 are less complex than those of the planner 23. In the controller 26, preferably only the difference between the actual position and the desired position of the device is compared, as a result of which calculations can be carried out and pictures can be analyzed at a higher frequency, thereby enabling the device 4 to be accurately moved to the desired position. By virtue thereof, it becomes possible for the control scheme 30 to process pictures at a higher speed than the control scheme 20.

Figure 4:
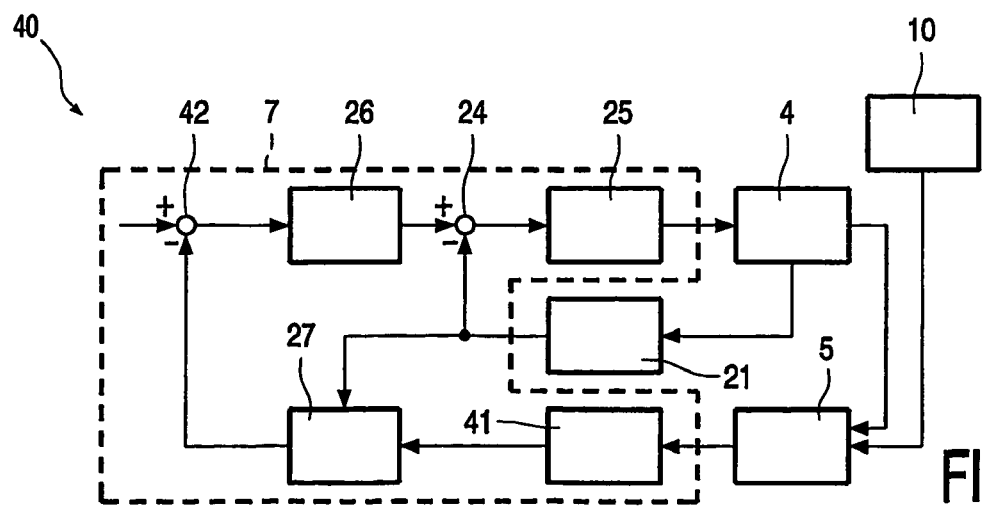

FIG. 4 shows a third embodiment of a control scheme 40 of the control system 7 of a system 1 in accordance with the invention. The picture obtained by means of the camera 5 is analyzed in an image processor 41; preferably only specific, clearly recognizable aspects of the desired position 10 which are visible on the picture are analyzed, thus enabling the position of the device 4 relative to the desired position 10 to be determined comparatively rapidly from the picture. The actual position of the device 4 is also determined by means of the encoders 21. The positions determined by means of the encoders 21 and the image processor 41 are supplied to a filter, for example an extended Kalman filter, wherein the actual position of the device 4 is accurately determined. If the encoders operate at a higher frequency than the camera 5, it is possible to obtain information by means of the encoders 21 which is more accurate than the information obtained from pictures produced by means of the camera 5. By combining the use of encoders and pictures obtained by means of the camera 5, more accurate and more rapid positioning of the device 4 on the desired position 10 can be achieved. The value originating from the filter 27 is supplied to a comparator 42, where the calculated, actual position is compared with the reference value. Otherwise the control scheme 40 corresponds to the control scheme 30.

The operation of the system 1 is as follows.

First, the device 4 is moved, by means of the control system 7, to a component feeder where a component is picked up by means of the nozzle 6. When picking up a component use may be made of the camera 5 to increase the pick-up accuracy. In addition, by means of the camera 5 the position of the component held by the nozzle 6 relative to the device 4 can be determined. On the basis of the information regarding the relative position of the substrate 8 with respect to the transport rails 6, which information is stored in the control system, as well as on the basis of the position of the device 4 determined by means of the encoder, the device 4 can be moved in the direction of the desired position 10.

As soon as the desired position 10 is detected by means of the camera 5, pictures of the substrate 8 and of the desired position 10 thereon are processed in the control system 7 at a comparatively low frequency of, for example, 25 Hz. These pictures are processed by means of the control scheme 20.

At this stage, the device 4 is to be moved close to the desired position 10 as rapidly as possible, which operation does not have to meet high accuracy requirements.

As soon as the distance between the device 4 and the desired position 10 falls below a specific threshold value, the number of pictures processed per time unit by means of the control system 7 is increased to, for example, 500 Hz. In addition, in the control system 7 switching from control scheme 20 to control scheme 30 or 40 takes place. In order to be able to rapidly process all pictures generated by means of this frequency, the area around the desired position 10 which is considered in the image processor is reduced and, preferably, only relevant aspects of the desired position, such as a specific element of a track pattern, are analyzed.

If necessary, different control schemes 20, 30, 40 may be accommodated in the control system 7, and, dependent upon the distance between the device 4 and the desired position 10, first the control scheme 20 and subsequently a control scheme 30 or 40 are applied. Alternatively, first control scheme 20 and subsequently control scheme 30 followed by control scheme 40 may be applied, the number of pictures to be processed per time unit being increased between each switching operation from control scheme 20 to control scheme 30 or 40.

It is also possible that the picture produced by the camera shows both the device and the desired position. From such a picture the distance between the device and the desired position can be directly derived. This is more accurate than the situation where the position of the device must be derived.

The invention claimed is:

1. A method of moving a device (4) provided with a camera (5) to a desired position (10) by means of a control system (7), wherein the camera (5) is coupled to the control system (7), the camera processing a number of pictures per time unit, characterized in that during moving said device, pictures of the desired position (10) are taken by means of the camera (5), the number of pictures processed per time unit by means of the control system (7) being increased as a distance between the device (4) and the desired position (10) is smaller.

2. A method as claimed in claim 1, characterized in that as the distance between the device (4) and the desired position (10) is smaller, an area situated around the desired position is reduced in a picture which is analyzed by means of the control system (7).

3. A method as claimed in claim 1, characterized in that the number of pictures processed per time unit by means of the control system (7) is increased step by step.

4. A method as claimed in claim 1, characterized in that by means of the control system (7), a movement of the device (4) observed by means of a sensor is combined with information from the pictures produced by means of the camera (5).

5. A system (1) comprising a device (4) provided with a camera (5), which device can be moved to a desired position (10) by means of a control system (7), wherein the camera (5) is coupled to the control system (7), the camera processing a number of pictures per time unit, characterized in that the control system (7) comprises means (20; 30; 40) far determining a distance between the device (4) and the desired position (10), as well as means (26; 42) for increasing the number of pictures to be processed per time unit.

6. A system (1) as claimed in claim 5, characterized in that the device (4) is provided with a sensor by means of which a movement of the device can be recorded.

\* \* \* \* \*